(12) United States Patent
Hammond et al.

(10) Patent No.: US 10,903,132 B2
(45) Date of Patent: Jan. 26, 2021

(54) WAFER-LEVEL FAN-OUT PACKAGE WITH ENHANCED PERFORMANCE

(71) Applicant: Qorvo US, Inc., Greensboro, NC (US)

(72) Inventors: Jonathan Hale Hammond, Oak Ridge, NC (US); Julio C. Costa, Oak Ridge, NC (US); Jon Chadwick, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/454,687

(22) Filed: Jun. 27, 2019

(65) Prior Publication Data

US 2020/0115220 A1 Apr. 16, 2020

Related U.S. Application Data

(60) Provisional application No. 62/743,962, filed on Oct. 10, 2018.

(51) Int. Cl.
*H01L 23/31* (2006.01)
*B81C 1/00* (2006.01)
(Continued)

(52) U.S. Cl.
CPC .......... *H01L 23/3135* (2013.01); *B81B 7/007* (2013.01); *B81B 7/0058* (2013.01);
(Continued)

(58) Field of Classification Search
CPC ........ H01L 23/3135; H01L 2224/1369; H01L 23/3128; H01L 23/12–15; H01L 25/042;
(Continued)

(56) References Cited

U.S. PATENT DOCUMENTS

| 4,093,562 | A | 6/1978 | Kishimoto |
| 4,366,202 | A | 12/1982 | Borovsky |

(Continued)

FOREIGN PATENT DOCUMENTS

| CN | 103811474 A | 5/2014 |
| CN | 103872012 A | 6/2014 |

(Continued)

OTHER PUBLICATIONS

Notice of Allowance for U.S. Appl. No. 15/287,273, dated Jun. 30, 2017, 8 pages.

(Continued)

*Primary Examiner* — Selim U Ahmed
*Assistant Examiner* — Evan G Clinton
(74) *Attorney, Agent, or Firm* — Withrow & Terranova, P.L.L.C.

(57) ABSTRACT

The present disclosure relates to a wafer-level fan-out package that includes a first thinned die, a second die, a multilayer redistribution structure underneath the first thinned die and the second die, a first mold compound over the second die, a second mold compound over the multilayer redistribution structure, and around the first thinned die and the second die, and a third mold compound. The second mold compound extends beyond the first thinned die to define an opening within the second mold compound and over the first thinned die, such that a top surface of the first thinned die is at a bottom of the opening. A top surface of the first mold compound and a top surface of the second mold compound are coplanar. The third mold compound fills the opening and is in contact with the top surface of the first thinned die.

20 Claims, 10 Drawing Sheets

Figure 1:
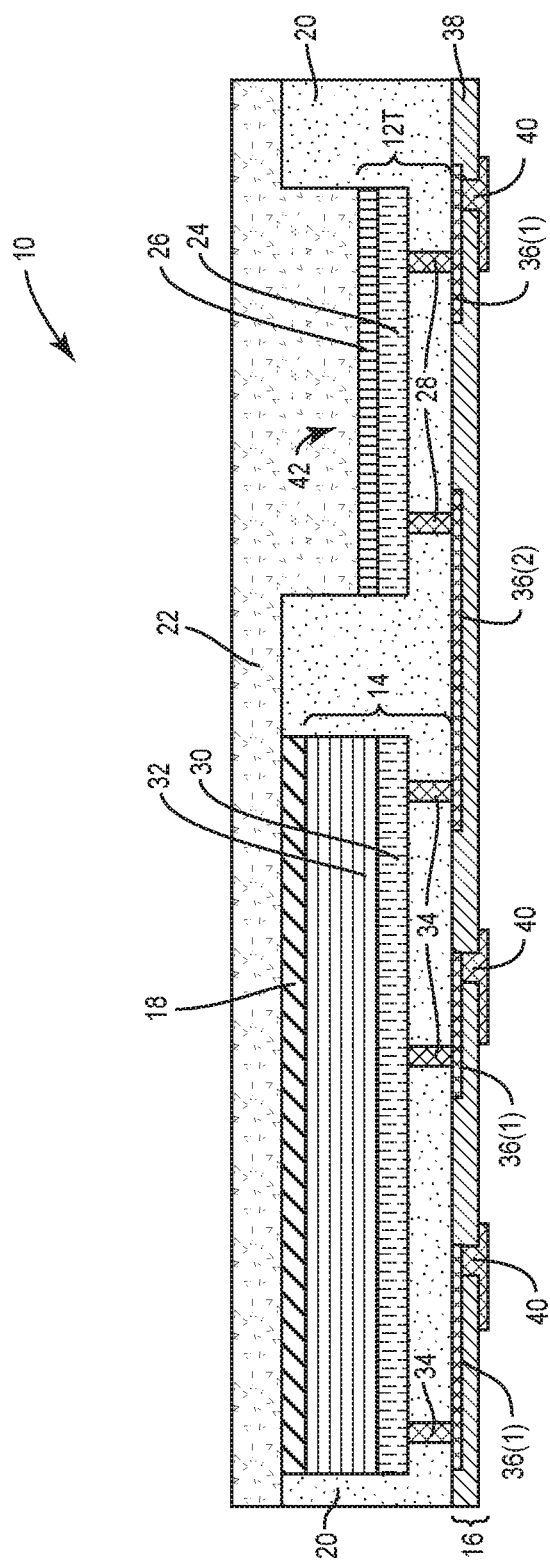

(51) Int. Cl.
   *B81B 7/00*     (2006.01)
   *H01L 25/065*   (2006.01)
   *H01L 23/538*   (2006.01)
   *H01L 21/56*    (2006.01)

(52) U.S. Cl.
   CPC ...... *B81C 1/00238* (2013.01); *B81C 1/00301* (2013.01); *H01L 25/0655* (2013.01); *B81B 2207/012* (2013.01); *B81B 2207/098* (2013.01); *B81C 2203/0154* (2013.01); *B81C 2203/0792* (2013.01); *H01L 21/568* (2013.01); *H01L 23/5389* (2013.01)

(58) Field of Classification Search
   CPC ............... H01L 25/0655; H01L 25/072; H01L 25/0753; H01L 25/115
   See application file for complete search history.

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzgerald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |

(56) References Cited

U.S. PATENT DOCUMENTS

| | | |
|---|---|---|
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1* | 2/2017 | Ho .................... H01L 23/5389 |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1* | 11/2017 | Costa .................... B81C 1/0023 |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0074263 A1 | 3/2019 | Costa et al. |
| 2019/0074271 A1 | 3/2019 | Costa et al. |
| 2019/0172842 A1 | 6/2019 | Whitefield |
| 2019/0189599 A1 | 6/2019 | Baloglu et al. |
| 2019/0287953 A1* | 9/2019 | Moon .................... H01L 21/52 |
| 2019/0304910 A1 | 10/2019 | Fillion |
| 2019/0312110 A1 | 10/2019 | Costa et al. |
| 2019/0326159 A1 | 10/2019 | Costa et al. |
| 2019/0378819 A1 | 12/2019 | Costa et al. |
| 2020/0006193 A1 | 1/2020 | Costa et al. |
| 2020/0058541 A1 | 2/2020 | Konishi et al. |

FOREIGN PATENT DOCUMENTS

| | | | |
|---|---|---|---|
| EP | 2996143 | A1 | 3/2016 |
| JP | S505733 | Y1 | 2/1975 |
| JP | H11-220077 | A | 8/1999 |
| JP | 200293957 | A | 3/2002 |
| JP | 2002252376 | A | 9/2002 |
| JP | 2006005025 | A | 1/2006 |
| JP | 2007227439 | A | 9/2007 |
| JP | 2008235490 | A | 10/2008 |
| JP | 2008279567 | A | 11/2008 |
| JP | 2009026880 | A | 2/2009 |
| JP | 2009530823 | A | 8/2009 |
| JP | 2011243596 | A | 12/2011 |

(56) References Cited

FOREIGN PATENT DOCUMENTS

| WO | 2007074651 A1 | 7/2007 |
|----|---------------|--------|
| WO | 2018083961 A1 | 5/2018 |
| WO | 2018125242 A1 | 7/2018 |

OTHER PUBLICATIONS

Corrected Notice of Allowability for U.S. Appl. No. 15/287,273, dated Jul. 21, 2017, 5 pages.

Supplemental Notice of Allowability for U.S. Appl. No. 15/287,273, dated Sep. 7, 2017, 5 pages.

Extended European Search Report for European Patent Application No. 15184861.1, dated Jan. 25, 2016, 6 pages.

Office Action of the Intellectual Property Office for Taiwanese Patent Application No. 104130224, dated Jun. 15, 2016, 9 pages.

Non-Final Office Action for U.S. Appl. No. 14/885,202, dated Apr. 14, 2016, 5 pages.

Final Office Action for U.S. Appl. No. 14/885,202, dated Sep. 27, 2016, 7 pages.

Advisory Action for U.S. Appl. No. 14/885,202, dated Nov. 29, 2016, 3 pages.

Notice of Allowance for U.S. Appl. No. 14/885,202, dated Jan. 27, 2017, 7 pages.

Notice of Allowance for U.S. Appl. No. 14/885,202, dated Jul. 24, 2017, 8 pages.

Notice of Allowance for U.S. Appl. No. 14/885,243, dated Aug. 31, 2016, 8 pages.

Non-Final Office Action for U.S. Appl. No. 12/906,689, dated May 27, 2011, 13 pages.

Non-Final Office Action for U.S. Appl. No. 12/906,689, dated Nov. 4, 2011, 20 pages.

Search Report for Japanese Patent Application No. 2011-229152, created on Feb. 22, 2013, 58 pages.

Office Action for Japanese Patent Application No. 2011-229152, drafted May 10, 2013, 7 pages.

Final Rejection for Japanese Patent Application No. 2011-229152, drafted Oct. 25, 2013, 2 pages.

International Search Report and Written Opinion for PCT/US2016/045809, dated Oct. 7, 2016, 11 pages.

Non-Final Office Action for U.S. Appl. No. 15/652,867, dated Oct. 10, 2017, 5 pages.

Bernheim et al., "Chapter 9: Lamination," Tools and Manufacturing Engineers Handbook (book), Apr. 1, 1996, Society of Manufacturing Engineers, p. 9-1.

Fillion R. et al., "Development of a Plastic Encapsulated Multichip Technology for High Volume, Low Cost Commercial Electronics," Electronic Components and Technology Conference, vol. 1, May 1994, IEEE, 5 pages.

Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.

International Search Report and Written Opinion for PCT/US2017/046744, dated Nov. 27, 2017, 17 pages.

International Search Report and Written Opinion for PCT/US2017/046758, dated Nov. 16, 2017, 19 pages.

International Search Report and Written Opinion for PCT/US2017/046779, dated Nov. 29, 2017, 17 pages.

Non-Final Office Action for U.S. Appl. No. 15/616,109, dated Oct. 23, 2017, 16 pages.

Corrected Notice of Allowability for U.S. Appl. No. 14/851,652, dated Oct. 20, 2017, 5 pages.

Final Office Action for U.S. Appl. No. 15/262,457, dated Dec. 19, 2017, 12 pages.

Supplemental Notice of Allowability and Applicant-Initiated Interview Summary for U.S. Appl. No. 15/287,273, dated Oct. 18, 2017, 6 pages.

Supplemental Notice of Allowability for U.S. Appl. No. 15/287,273, dated Nov. 2, 2017, 5 pages.

Non-Final Office Action for U.S. Appl. No. 15/491,064, dated Jan. 2, 2018, 9 pages.

Notice of Allowance for U.S. Appl. No. 14/872,910, dated Nov. 17, 2017, 11 pages.

Notice of Allowance for U.S. Appl. No. 15/648,082, dated Nov. 29, 2017, 8 pages.

Non-Final Office Action for U.S. Appl. No. 15/652,826, dated Nov. 3, 2017, 5 pages.

Notice of Allowance for U.S. Appl. No. 15/229,780, dated Oct. 3, 2017, 7 pages.

Supplemental Notice of Allowability for U.S. Appl. No. 15/287,273, dated Jan. 17, 2018, 5 pages.

Notice of Allowance for U.S. Appl. No. 15/498,040, dated Feb. 20, 2018, 8 pages.

Non-Final Office Action for U.S. Appl. No. 15/387,855, dated Jan. 16, 2018, 7 pages.

Non-Final Office Action for U.S. Appl. No. 15/795,915, dated Feb. 23, 2018, 6 pages.

International Preliminary Report on Patentability for PCT/US2016/045809, dated Feb. 22, 2018, 8 pages.

Advisory Action and Applicant-Initiated Interview Summary for U.S. Appl. No. 15/262,457, dated Feb. 28, 2018, 5 pages.

Supplemental Notice of Allowability for U.S. Appl. No. 15/287,273, dated Feb. 23, 2018, 5 pages.

Non-Final Office Action for U.S. Appl. No. 15/676,415, dated Mar. 27, 2018, 14 page.

Non-Final Office Action for U.S. Appl. No. 15/676,621, dated Mar. 26, 2018, 16 pages.

Notice of Allowance for U.S. Appl. No. 15/795,915, dated Jun. 15, 2018, 7 pages.

Final Office Action for U.S. Appl. No. 15/387,855, dated May 24, 2018, 9 pages.

Non-Final Office Action for U.S. Appl. No. 15/262,457, dated Apr. 19, 2018, 10 pages.

Notice of Allowance for U.S. Appl. No. 15/491,064, dated Apr. 30, 2018, 9 pages.

Non-Final Office Action for U.S. Appl. No. 15/601,858, dated Jun. 26, 2018, 12 pages.

Notice of Allowance for U.S. Appl. No. 15/616,109, dated Jul. 2, 2018, 7 pages.

Notice of Allowance for U.S. Appl. No. 15/676,621, dated Jun. 5, 2018, 8 pages.

Raskin, Jean-Pierre et al., "Substrate Crosstalk Reduction Using SOI Technology," IEEE Transactions on Electron Devices, vol. 44, No. 12, Dec. 1997, pp. 2252-2261.

Rong, B., et al., "Surface-Passivated High-Resistivity Silicon Substrates for RFICs," IEEE Electron Device Letters, vol. 25, No. 4, Apr. 2004, pp. 176-178.

Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.

Final Office Action for U.S. Appl. No. 13/852,648, dated Nov. 26, 2013, 21 pages.

Applicant-Initiated Interview Summary for U.S. Appl. No. 13/852,648, dated Jan. 27, 2014, 4 pages.

Advisory Action for U.S. Appl. No. 13/852,648, dated Mar. 7, 2014, 4 pages.

Notice of Allowance for U.S. Appl. No. 13/852,648, dated Jun. 16, 2014, 9 pages.

Notice of Allowance for U.S. Appl. No. 13/852,648, dated Sep. 26, 2014, 8 pages.

(56) References Cited

OTHER PUBLICATIONS

Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.

Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Appl. No. 16/204,214, dated Mar. 6, 2020, 14 pages.
Advisory Action for U.S. Appl. No. 16/204,214, dated Apr. 15, 2020, 3 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.

(56) References Cited

OTHER PUBLICATIONS

International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.

(56) References Cited

OTHER PUBLICATIONS

Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 300-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
MazuréC. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Sytems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Quayle Action for U.S. Appl. No. 16/703,251, dated Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.

(56) References Cited

OTHER PUBLICATIONS

Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/204,214, dated May 19, 2020, 15 pages.
Non-Final Office Action for U.S. Appl. No. 16/454,809, dated May 15, 2020, 12 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Notice of Allowance for U.S. Appl. No. 16/703,251, dated Aug. 27, 2020, 8 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.

* cited by examiner

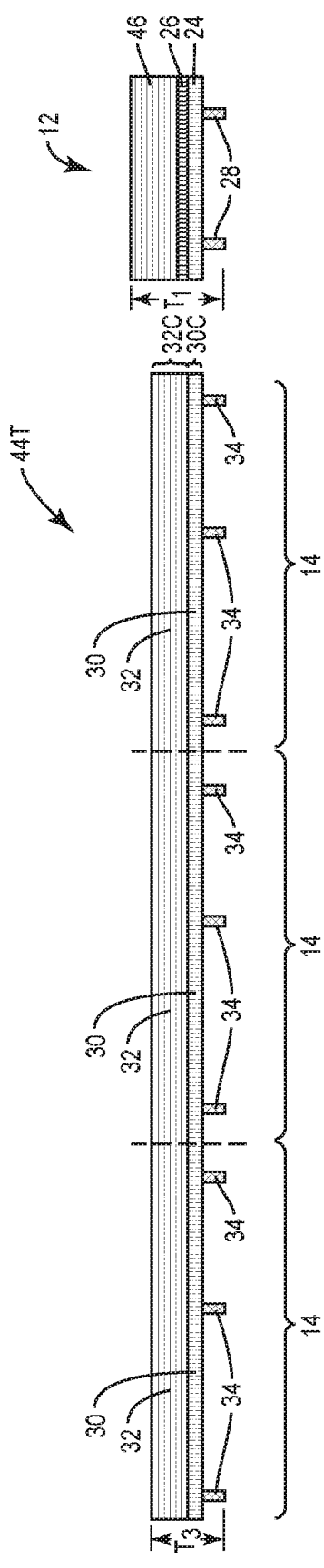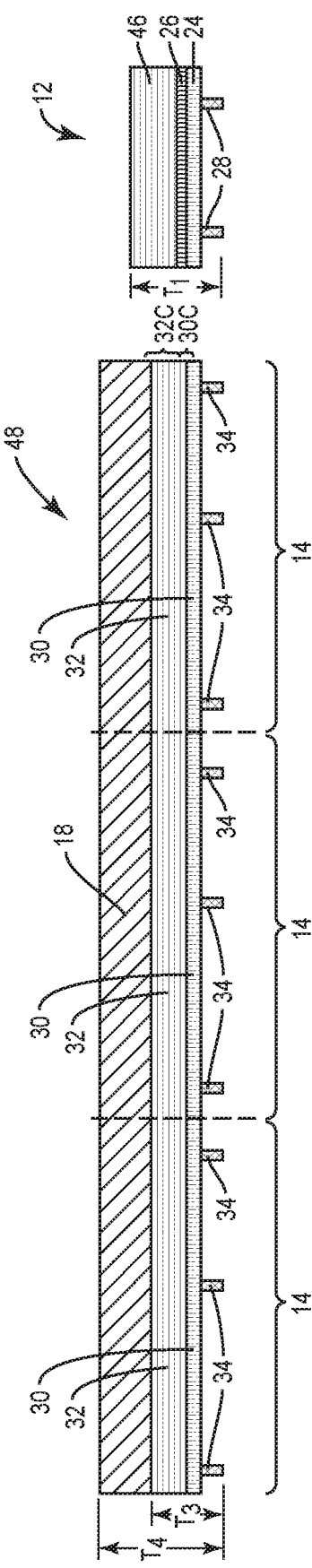

WAFER-LEVEL FAN-OUT PACKAGE WITH ENHANCED PERFORMANCE

RELATED APPLICATIONS

This application claims the benefit of provisional patent application Ser. No. 62/743,962, filed Oct. 10, 2018, the disclosure of which is hereby incorporated herein by reference in its entirety.

This application is related to U.S. patent application Ser. No. 16/454,809, filed Jun. 27, 2019, entitled "WAFER-LEVEL FAN-OUT PACKAGE WITH ENHANCED PERFORMANCE;" the disclosure of which is hereby incorporated herein by reference in its entirety.

FIELD OF THE DISCLOSURE

The present disclosure relates to a wafer-level fan-out (WLFO) package and a process for making the same, and more particularly to a WLFO package with enhanced thermal, electrical, and rigidity performance, and a packaging process to enhance thermal, electrical, and rigidity performance of a WLFO package.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for RF device fabrication, it is well known in the industry that the conventional silicon substrates may have two undesirable properties for the RF devices: harmonic distortion and low resistivity values. Harmonic distortion is a critical impediment for achieving high level linearity in the RF devices built over silicon substrates. In addition, the low resistivity encountered in the silicon substrates may degrade quality factors (Q) at high frequencies of microelectromechanical systems (MEMS) or other passive components.

Further, high speed and high performance transistors are more densely integrated in RF devices, even as they are required to carry more power. Consequently, the amount of heat generated by the RF devices will increase significantly due to the large amount of power passing through the transistors, the large number of transistors integrated in the RF devices, and the high operation speed of the transistors. Accordingly, it is desirable to package the RF devices in a configuration for better heat dissipation.

Wafer-level fan-out (WLFO) packaging technology and embedded wafer-level ball grid array (EWLB) technology currently attract substantial attention in portable RF applications. WLFO and EWLB technologies are designed to provide high density input/output ports (I/O) as well as low profile package height without increasing the size of the component semiconductor chips. The I/O pad size on the chip remains small keeping die size to a minimum. This capability allows for densely packaging the RF devices within a single wafer.

To accommodate the increased heat generation of the RF devices, to reduce deleterious harmonic distortion and quality factor losses of the silicon substrate, and to utilize advantages of WLFO/EWLB packaging technologies, it is therefore an object of the present disclosure to provide a packaging process for a wafer-level fan-out (WLFO) package with enhanced thermal and electrical performance.

SUMMARY

The present disclosure relates to a wafer-level fan-out (WLFO) package with enhanced thermal, electrical, and rigidity performance, and a packaging process to enhance thermal, electrical, and rigidity performance of the WLFO package. The disclosed WLFO package includes a first thinned die, a second die, a multilayer redistribution structure, a first mold compound, a second mold compound, and a third mold compound. The first thinned die includes a first device layer, a first dielectric layer over the first device layer, and a number of first die bumps underneath the first device layer. The second die includes a second device layer, a silicon substrate over the second device layer, and a number of second die bumps underneath the second device layer. The first thinned die and the second die reside over the multilayer redistribution structure. The multilayer redistribution structure includes a number of package contacts on a bottom surface of the multilayer redistribution structure and redistribution interconnections that connect the package contacts to certain ones of the first die bumps and certain ones of the second die bumps. The first mold compound resides over the silicon substrate of the second die. The second mold compound resides over the multilayer redistribution structure, resides around and underneath the first thinned die, and resides around and underneath the second die. Herein, the second mold compound extends beyond a top surface of the first thinned die to define an opening within the second mold compound and over the first thinned die. The top surface of the first thinned die is at a bottom of the opening. A top surface of the first mold compound and a top surface of the second mold compound are coplanar. The third mold compound fills the opening and is in contact with the top surface of the first thinned die.

In one embodiment of the WLFO package, the redistribution interconnections electrically connect the first thinned die and the second die. Herein, the first thinned die provides a microelectromechanical systems (MEMS) component and the second die provides a complementary metal-oxide-semiconductor (CMOS) controller that controls the MEMS component.

In one embodiment of the WLFO package, the first thinned die is formed from a silicon-on-insulator (SOI) structure, wherein the first device layer of the first thinned die is formed from a silicon layer of the SOI structure, and the first dielectric layer of the first thinned die is a buried oxide layer of the SOI structure.

In one embodiment of the WLFO package, the third mold compound has an electrical resistivity greater that 1E6 Ohm-cm.

In one embodiment of the WLFO package, the third mold compound has a thermal conductivity greater than 2 W/m·K.

In one embodiment of the WLFO package, the third mold compound has a thermal conductivity greater than 10 W/m·K.

In one embodiment of the WLFO package, the first mold compound, the second mold compound, and the third mold compound are formed from different materials.

In one embodiment of the WLFO package, the first mold compound and the second mold compound are formed from a same material.

In one embodiment of the WLFO package, the top surface of the first thinned die at the bottom of the opening is a top surface of the first dielectric layer.

In one embodiment of the WLFO package, the multilayer redistribution structure is glass-free, connections between the redistribution interconnections and the first die bumps are solder-free, and connections between the redistribution interconnections and the second die bumps are solder-free.

In one embodiment of the WLFO package, a portion of the third mold compound resides over the first mold compound and the second mold compound.

In one embodiment of the WLFO package, the top surface of the first mold compound, the top surface of the second mold compound, and a top surface of the third mold compound are coplanar.

According to another embodiment, the WLFO package further includes a fourth mold compound, which resides over the top surface of the first mold compound, the top surface of the second mold compound, and the top surface of the third mold compound.

In one embodiment of the WLFO package, the first mold compound, the second mold compound, and the fourth mold compound are formed from a same material.

In one embodiment of the WLFO package, a periphery of the first mold compound and a periphery of the silicon substrate of the second die are coincident.

According to an exemplary process, a mold package that includes a first die, a second die, a first mold compound, and a second mold compound is firstly provided. Herein, the first die includes a first device layer, a first dielectric layer over the first device layer, a first silicon substrate over the first dielectric layer, and a number of first die bumps underneath the first device layer. The second die includes a second device layer, a second silicon substrate over the second device layer, and a number of second die bumps underneath the second device layer. The first mold compound resides over the silicon substrate of the second die. The second mold compound resides around and underneath the first die and the second die, such that the second mold compound covers sidewalls and a bottom surface of the first die, covers sidewalls and a bottom surface of the second die, covers sidewalls of the first mold compound, and encapsulates the first die bumps and the second die bumps, wherein a top surface of the first mold compound, a top surface of the second mold compound, and a backside of the first silicon substrate are coplanar. Next, the first silicon substrate is substantially removed to provide a first thinned die and form an opening, which is within the first mold compound and over the first thinned die. The first thinned die has a top surface exposed at a bottom of the opening. A third mold compound is then applied to substantially fill the opening and directly contact the top surface of the first thinned die. After the third mold compound is applied, the second mold compound is thinned to expose each first die bump and each second die bump. Lastly, a multilayer redistribution structure is formed underneath the second mold compound. The multilayer redistribution structure includes a number of package contacts on a bottom surface of the multilayer redistribution structure and redistribution interconnections that connect the package contacts to certain ones of the first die bumps and certain ones of the second die bumps.

In one embodiment of the exemplary process, the third mold compound is applied by a compression molding process.

In one embodiment of the exemplary process, a molding pressure used for applying the third mold compound is lower than 1000 psi.

In one embodiment of the exemplary process, providing the mold package starts with placing the first die and a mold die on a mold tape. Herein, the mold die includes the second die and the first mold compound over the second die. The first silicon substrate of the first die and the first mold compound of the mold die are in contact with the mold tape, and the first die bumps and the second die bump are placed upward. The second mold compound is then applied over the mold tape to encapsulate the first die and the mold die. Next, the mold tape is removed to provide a precursor package, such that a portion of the first mold compound and a portion of the first silicon substrate are exposed. After flipping the precursor package, the first die bumps and the second die bumps are downward and encapsulated by the second mold compound. No portion of the second mold compound extends above the first silicon substrate of the first die and the first mold compound. A top surface of the precursor package is planarized to provide the mold package, such that the top surface of the first mold compound, the top surface of the second mold compound, and the backside of the first silicon substrate are coplanar.

In one embodiment of the exemplary process, before placing the first die and the combination of the second die and the first mold compound on the mold tape, a thickness of the first die and a thickness of the combination of the second die and the first mold compound are the same.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary wafer-level fan-out (WLFO) package according to one embodiment of the present disclosure.

FIGS. 2-10 provide exemplary steps that illustrate a process to fabricate a mold package according to one embodiment of the present disclosure.

Figure 10:
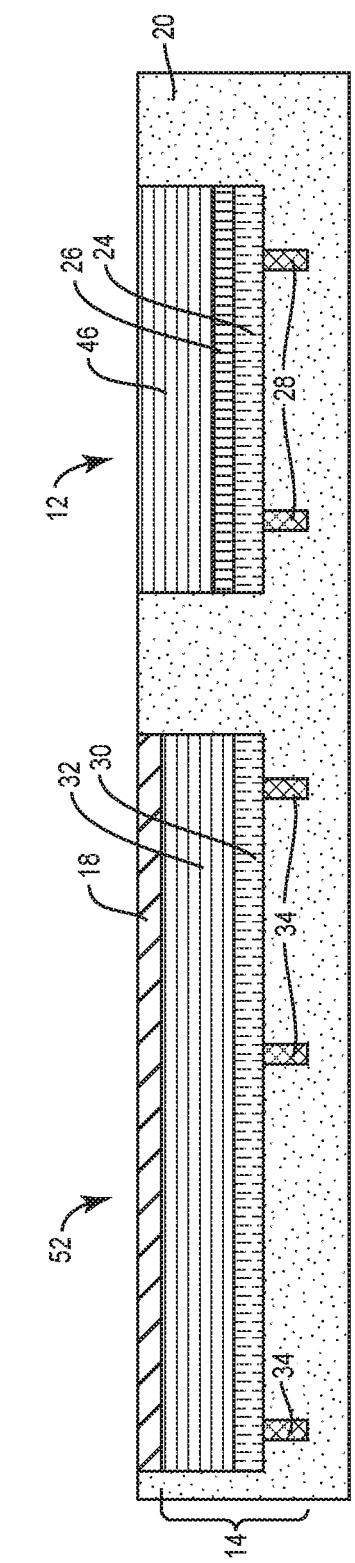

FIGS. 11-16 illustrate the steps to provide the WLFO package shown in FIG. 1 from the mold package shown in FIG. 10

It will be understood that for clarity of illustration, FIGS. 1-16 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a wafer-level fan-out (WLFO) package with enhanced thermal, electrical, and rigidity performance, and a packaging process for making the same. FIG. 1 shows an exemplary WLFO package 10 according to one embodiment of the present disclosure. For the purpose of this illustration, the exemplary WLFO package 10 includes a first thinned die 12T, a second die 14, a multilayer redistribution structure 16, a first mold compound 18, a second mold compound 20, and a third mold compound 22. In different applications, the WLFO package 10 may include fewer or more dies. For instance, in some applications, the WLFO package 10 may include the first thinned die 12, while the second die 14 is omitted. In some applications, the WLFO package 10 may include multiple first thinned dies 12 without the second die 14. In some applications, the WLFO package 10 may include the multiple first thinned dies 12T and one second die 14. In some applications, the WLFO package 10 may include the multiple first thinned dies 12T and multiple second dies 14. In some applications, besides the first thinned die 12T and the second die 14, the WLFO package 10 may include some integrated passive device dies (not shown).

In detail, the first thinned die 12T includes a first device layer 24, a first dielectric layer 26 over the first device layer 24, and a number of first die bumps 28 underneath the first device layer 24. In one embodiment, the first thinned die 12T may be formed from a silicon-on-insulator (SOI) structure, which refers to a structure including a silicon substrate, a silicon layer, and a buried oxide layer sandwiched between the silicon substrate and the silicon layer. The first device layer 24 of the first thinned die 12T may be formed by integrating electronic components (not shown) in or on the silicon layer of the SOI structure. The first dielectric layer 26 of the first thinned die 12T may be the buried oxide layer of the SOI structure. In addition, the silicon substrate of the SOI structure is removed substantially to complete the first thinned die 12T (more details in the following discussion). Herein, the first device layer 24 may have a thickness between 0.1 µm and 50 µm, the first dielectric layer 26 may have a thickness between 10 nm and 2000 nm, and each first die bump 28 may have a thickness between 5 µm and 200 µm. A total thickness of the first thinned die 12T may be between 5 µm and 260 µm.

In another embodiment, the first thinned die 12T may provide a microelectromechanical systems (MEMS) component (not shown) which is typically a switch and within the first device layer 24. Herein, the first device layer 24 may have a thickness between 0.5 µm and 100 µm, and may be formed from a combination of dielectric and metal layers (such as silicon oxide, silicon nitride, aluminum, titanium, copper, or the like). The first dielectric layer 26 may have a thickness between 10 nm and 10000 nm, and may be formed from silicon oxide, silicon nitride, aluminum oxide, or aluminum nitride. Each first die bump 28 may have a thickness between 5 µm and 200 µm, and a total thickness of the first thinned die 12T may be between 5 µm and 310 µm.

Notice that the first thinned die 12T has essentially no silicon substrate over the first dielectric layer 26. Herein, essentially no silicon substrate over the first dielectric layer 26 refers to at most 2 µm silicon substrate over the dielectric layer. In desired cases, the first thinned die 12T does not include any silicon substrate over the first dielectric layer 26, such that a top surface of first thinned die 12T is a top surface of the first dielectric layer 26. For other cases, the top surface of the first thinned die 12T may be a top surface of the thin silicon substrate.

The second die 14 includes a second device layer 30, a second silicon substrate 32 over the second device layer 30, and a number of second die bumps 34 underneath the second device layer 30. If the first thinned die 12T provides a MEMS component, the second die 14 may provide a complementary metal-oxide-semiconductor (CMOS) controller (not shown) that is within the second device layer 30 and controls the MEMS component within the first thinned die 12T. Herein, the second die 14 may have a thickness between 25 µm and 250 µm or between 10 µm and 750 µm, and the second silicon substrate 32 may have a thickness between 25 µm and 250 µm or between 10 µm and 750 µm, respectively. The second device layer 30 may have a thickness between 0.1 μm and 50 μm, and may be formed from a combination of dielectric and metal layers (such as silicon oxide, silicon nitride, aluminum, titanium, copper, or the like). In addition, if the first thinned die 12T does not provide a MEMS component and is formed from a SOI structure, the second die 14 may be omitted.

Herein, the first thinned die 12T and the second die 14 reside over the multilayer redistribution structure 16, which includes a number of redistribution interconnections 36, a dielectric pattern 38, and a number of package contacts 40. For the purpose of this illustration, the redistribution interconnections 36 include three first redistribution interconnections 36(1) and one second redistribution interconnection 36(2). In different applications, the redistribution interconnections 36 may include fewer or more first redistribution interconnections 36(1)/second redistribution interconnections 36(2). Each first redistribution interconnection 36(1) is configured to connect one package contact 40 to a corresponding one of the first and second die bumps 28 and 34. The second redistribution interconnection 36(2) is configured to connect one first die bump 28 to a corresponding second die bump 34, such that the first thinned die 12T is electrically connected to the second die 14. The connections between the redistribution interconnections 36 and the first/second die bumps 28 and 34 are solder-free.

The dielectric pattern 38 is formed around and underneath each redistribution interconnection 36. Herein, a bottom portion of each first redistribution interconnection 36(1) is exposed through the dielectric pattern 38, while the second redistribution interconnection 36(2) is fully encapsulated by the dielectric pattern 38. In different applications, there may be extra redistribution interconnections (not shown) electrically coupled to the first redistribution interconnections 36(1) through the dielectric pattern 38, and extra dielectric patterns (not shown) formed underneath the dielectric pattern 38, such that a bottom portion of each extra redistribution interconnection is exposed.

In this embodiment, each package contact 40 is formed at a bottom of the multilayer redistribution structure 16 and electrically coupled to a corresponding first redistribution interconnection 36(1) through the dielectric pattern 38. Consequently, the first redistribution interconnections 36(1) connect the package contacts 40 to corresponding ones of the first and second die bumps 28 and 34. In addition, the package contacts 40 are separate from each other and extend underneath the dielectric pattern 38.

The multilayer redistribution structure 16 may be free of glass fiber or glass-free. Herein, the glass fiber refers to individual glass strands twisted to become a larger grouping. These glass strands may then be woven into a fabric. The dielectric pattern 38 may be formed of benzocyclobutene (BCB), polyimide, or other dielectric materials. The redistribution interconnections 36 may be formed of copper or other suitable metals. The package contacts 40 may be formed of at least one of copper, gold, nickel, and palladium. The multilayer redistribution structure 16 may have a thickness between 2 μm and 300 μm.

The first mold compound 18 resides over the second silicon substrate 32 of the second die 14. A periphery of the first mold compound 18 and a periphery of the second silicon substrate 32 are coincident. The first mold compound 18 may be an organic epoxy resin system or the like, which can be used as an etchant barrier to protect the second die 14 against etching chemistries (more details in the following discussion), such as potassium hydroxide (KOH), sodium hydroxide (NaOH), and acetylcholine (ACH).

The second mold compound 20 resides over the multilayer redistribution structure 16, resides around and underneath the first thinned die 12T, and resides around and underneath the second die 14. Herein, the second mold compound 20 covers a bottom surface of the first device layer 24 and a bottom surface of the second device layer 30, and encapsulates the first die bumps 28 and the second die bumps 24. In addition, the second mold compound 20 covers side walls of the first thinned die 12T and extends vertically beyond a top surface of the first thinned die 12T to define an opening 42 within the second mold compound 20 and over the first thinned die 12T. The top surface of the first thinned die 12T is at a bottom of the opening 42. If the first thinned die 12T does not include any silicon substrate over the first dielectric layer 26, the top surface of the first dielectric layer 26 is at the bottom of the opening 42. If the first thinned die 12T includes a thin silicon substrate (<2 μm thickness) over the first dielectric layer 26, the thin silicon substrate is at the bottom of the opening 42 (not shown). Further, the second mold compound covers side walls of the second die 14 and side walls of the first mold compound 18, such that a top surface of the first mold compound 18 and a top surface of the second mold compound 20 are coplanar. The second mold compound 20 may be formed of a same material as the first mold compound 18, such as an organic epoxy resin system or the like. The second mold compound 20 may be used as an etchant barrier to protect the first thinned die 12T and the second die 14 against etching chemistries (more details in the following discussion).

The third mold compound 22 substantially fills the opening 42, and is in contact with the top surface of the first thinned die 12T. Herein, substantially filling an opening refers to filling at least 75% of the entire opening. If there is no silicon substrate left in the opening 42, the third mold compound 22 will directly reside over the first dielectric layer 26. In some cases, a portion of the third mold compound 22 may further reside over the first and second mold compounds 18 and 20. The third mold compound 22 is separated from the second die 14 by the first mold compound 18. A top surface of the second die 14 is only in contact with the first mold compound 18.

The third mold compound 22 has a thermal conductivity greater than 2 W/m·K or greater than 10 W/m·K, and has an electrical resistivity greater than 1E6 Ohm-cm. In general, the higher the thermal conductivity of the third mold compound 22, the better the thermal performance of the first thinned die 12T. Further, the high electrical resistivity of the third mold compound 22 may improve the quality factor (Q) at high frequencies of the MEMS component provided in the first thinned die 12T, or may reduce signal loss in the first thinned die 12T if formed from an SOI structure.

The third mold compound 22 may be formed of thermoplastics or thermoset materials, such as PPS (poly phenyl sulfide), overmold epoxies doped with boron nitride or alumina thermal additives, or the like. The first, second, and third mold compounds 18, 20, and 22 may be formed of a same material or different materials. For instance, the first mold compound 18 and the second mold compound 20 may be formed from a same material, while the third mold compound 22 is formed from a different material. Unlike the third mold compound 22, the first and second mold compounds 18 and 20 do not have thermal conductivity requirements.

FIGS. 2-16 provide exemplary steps to fabricate the WLFO package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-16.

Figure 2:
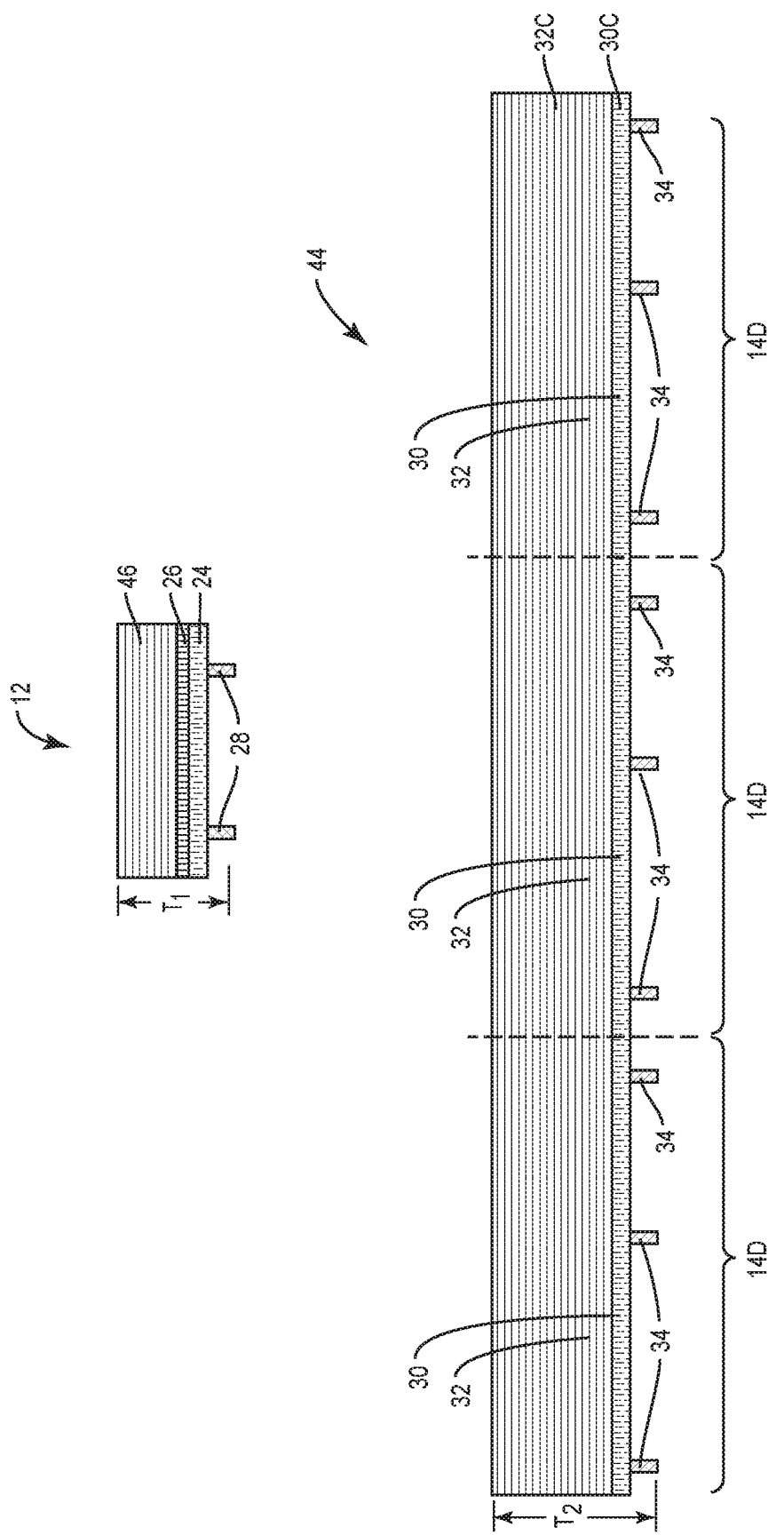

FIGS. 2-10 provide exemplary steps to fabricate a mold package, which is used to manufacture the WLFO package 10. Initially, a first die 12, and a wafer 44 with a number of second intact dies 14D are provided, as illustrated in FIG. 2. The first die 12 includes the first device layer 24, the first dielectric layer 26 over the first device layer 24, the first die bumps 28 underneath the first device layer 24, and a first silicon substrate 46 over the first dielectric layer 26. In one embodiment, the first die 12 may be formed from a SOI structure. The first device layer 24 of the first die 12 may be formed by integrating electronic components (not shown) in or on the silicon layer of the SOI structure. The first dielectric layer 26 of the first die 12 may be the buried oxide layer of the SOI structure. The first silicon substrate 46 of the first die 12 may be the silicon substrate of the SOI structure. Herein, the first die 12 (including the first die bumps 28) may have a total thickness T1 between 25 µm and 250 µm or between 10 µm and 750 µm, and the first silicon substrate 46 may have a thickness between 25 µm and 250 µm or between 10 µm and 750 µm, respectively.

In another embodiment, the first die 12 may provide a MEMS component (not shown), which is typically a switch and within the first device layer. Herein, the first die 12 (including the first die bumps 28) may have the thickness T1 between 25 µm and 300 µm or between 10 µm and 800 µm, and the first silicon substrate 46 may have a thickness between 25 µm and 300 µm or between 10 µm and 800 µm, respectively.

For the purpose of this illustration, the wafer 44 includes three second intact dies 14D. In different applications the wafer 44 may include fewer or more second intact dies 14D. Each second intact die 14D includes the second device layer 30, the second silicon substrate 32 over the second device layer 30, and the second die bumps 34 underneath the second device layer 30. The second device layer 30 from each second intact die 14D is formed from a common device layer 30C, while the second silicon substrate 32 from each second intact die 14D is formed from a common substrate 32C. Herein, the wafer 44 as well as each second intact die 14D (including the second die bumps 28) may have a thickness T2 between 10 µm and 750 µm, and the second silicon substrate 32 may have a thickness between 10 µm and 750 µm.

Herein, if the thickness T2 of the wafer 44 is thicker than the thickness T1 of the first die 12, a first thinning process is applied to the common substrate 32C to provide a thinned wafer 44T with a number of second dies 14, as shown in FIG. 3. The common substrate 32C is thinned down, until a thickness T3 of the thinned wafer 44T as well as each second die 14 (including the second die bumps 34) is thinner than the thickness T1 of the first die 12. Typically, each second die 14 still includes the second silicon substrate 32 and the thickness T3 may be between 10 µm and 750 µm. The remaining second silicon substrate 32 of each second die 14 may have a thickness between 10 µm and 750 µm. In a desired case, a difference between the thickness T1 of the first die 12 and the thickness T3 of the second die 14 may be between 2 µm and 100 µm. The first thinning process may be provided by a mechanical grinding process. If the thickness T2 of the wafer 44 is thinner than the thickness T1 of the first die 12, the first thinning step of the common substrate 32C may be omitted.

Next, the first mold compound 18 is applied over the remaining common substrate 32C to provide a mold wafer 48, as illustrated in FIG. 4. The first mold compound 18 may be an organic epoxy resin system or the like, and may be applied by various procedures, such as sheet molding, overmolding, compression molding, transfer molding, dam fill encapsulation, or screen print encapsulation. In a typical compression molding, a molding pressure used for applying the first mold compound 18 may be between 100 psi and 1000 psi. A curing process (not shown) is then used to harden the first mold compound 18. The curing temperature is between 100° C. and 320° C. depending on which material is used as the first mold compound 18.

Figure 5:
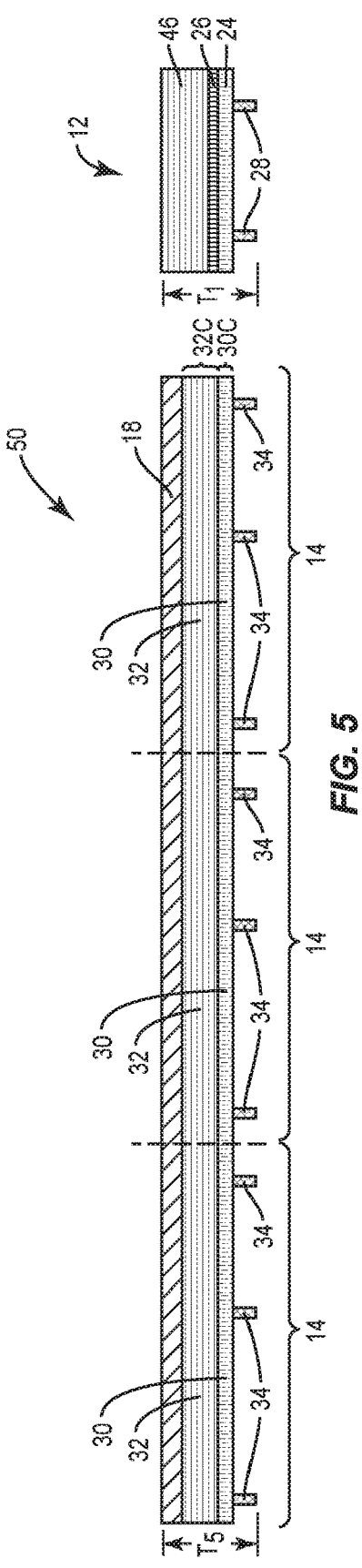

After the first mold compound 18 is formed, a thickness T4 of the mold wafer 48 may be thicker than the thickness T1 of the first die 12. A second thinning process may be followed to thin down the first mold compound 18 to provide a precursor wafer 50, as illustrated in FIG. 5. A thickness T5 of the precursor wafer 50 must be essentially the same as the thickness T1 of the first die 12. The second thinning step may be provided by a mechanical grinding process. In some cases, if the thickness T4 of the mold wafer 48 is essentially the same as the thickness T1 of the first die 12, the second thinning step may be omitted, and the precursor wafer 50 is the mold wafer 48.

Figure 6:
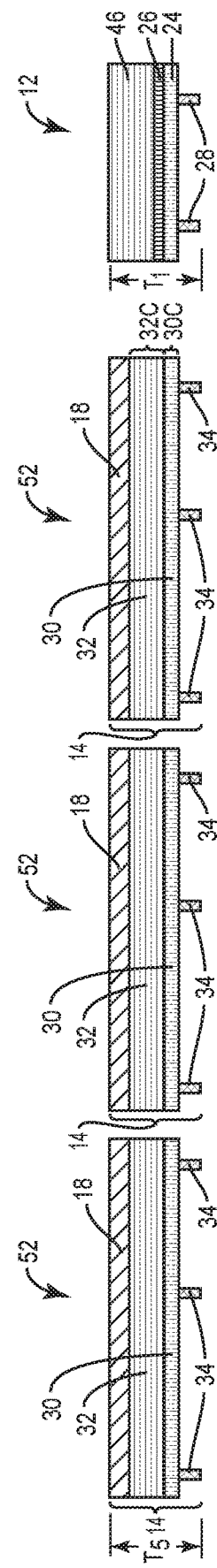

The precursor wafer 50 is then singulated into a number of mold dies 52 as shown in FIG. 6. Herein, each mold die 52 includes the second die 14 and the first mold compound 18 over the second die 14, and has the thickness T5, which is essentially the same as the thickness T1 of the first die 12. In each mold die 52, the periphery of the first mold compound 18 and the periphery of the second silicon substrate 32 of the second die 14 are coincident.

Figure 7:
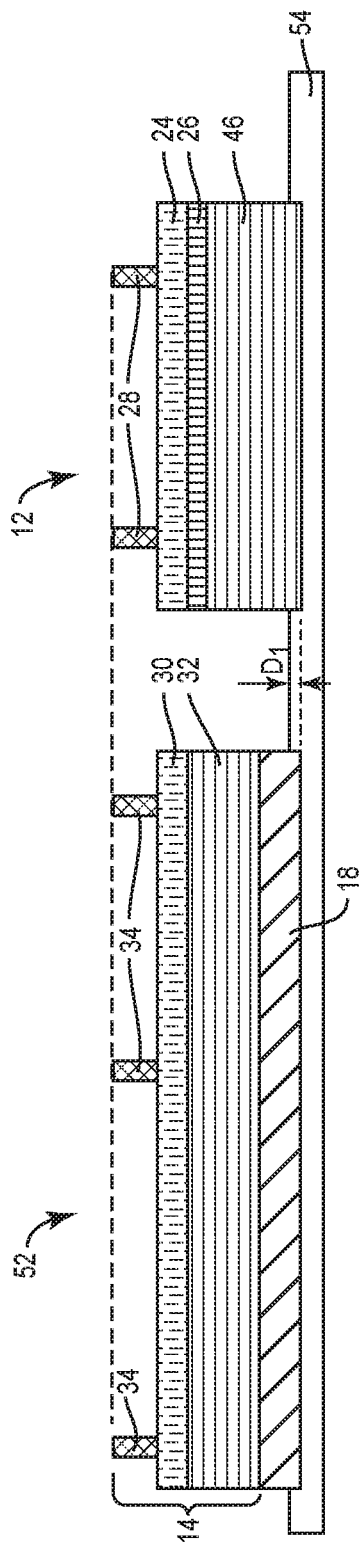

Next, one mold die 52 (including one second die 14) and one first die 12 are placed on a mold tape 54, as illustrated in FIG. 7. Herein, the first silicon substrate 46 of the first die 12 and the first mold compound 18 of the mold die 52 are in contact with the mold tape 54, and may extend into the mold tape 54 with a depth D1 about 3 µm. The first die bumps 28 and the second die bumps 34 are placed upward. Since the first die 12 and the mold die 52 have the same thickness, an end of each first die bump 28 and an end of each second die bump 34 are essentially at a same plane.

In different applications, there may be fewer or more dies placed on the mold tape 54. If the first die 12 does not provide a MEMS component and is formed from a SOI structure, the mold die 52 including the second die 14 may be omitted. Consequently, the fabrication steps shown in FIGS. 3-6 may be omitted. If the first die 12 provides a MEMS component, the second die 14 within the mold die 52 may provide a CMOS controller (not shown) that controls the MEMS component within the first die 12.

Figure 8:
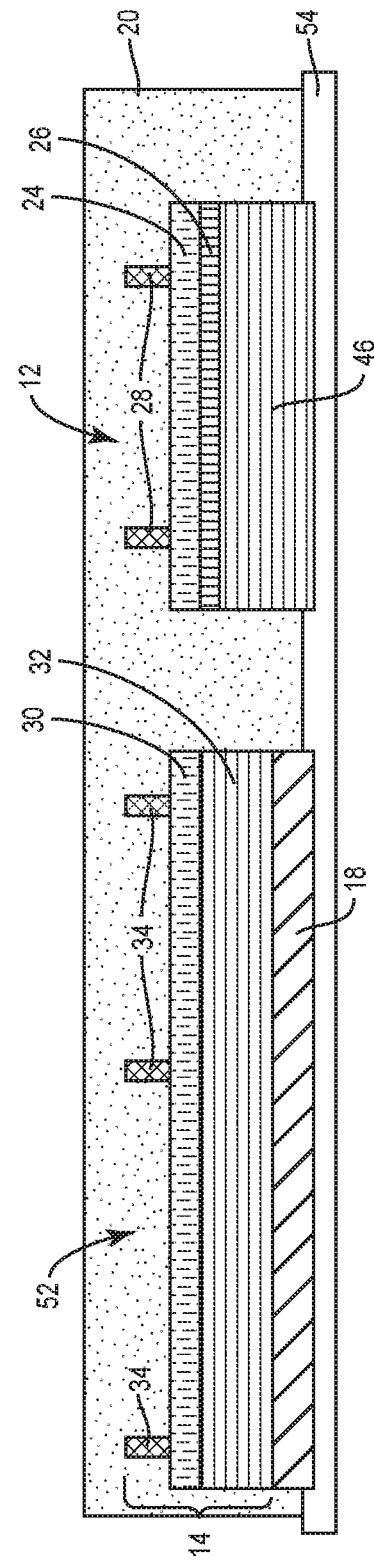

The second mold compound 20 is then applied over the mold tape 54 to encapsulate the first die 12 and the mold die 52, as illustrated in FIG. 8. The second mold compound 20 may be an organic epoxy resin system or the like, and may be applied by various procedures, such as sheet molding, overmolding, compression molding, transfer molding, dam fill encapsulation, or screen print encapsulation. In a typical compression molding, a molding pressure used for applying the second mold compound 20 may be between 100 psi and 1000 psi. Since the first die 12 and the mold die 52 are relatively thick, there may be no vertical deformations occurring to the first die 12 and the mold die 52 during this molding step.

Figure 9:
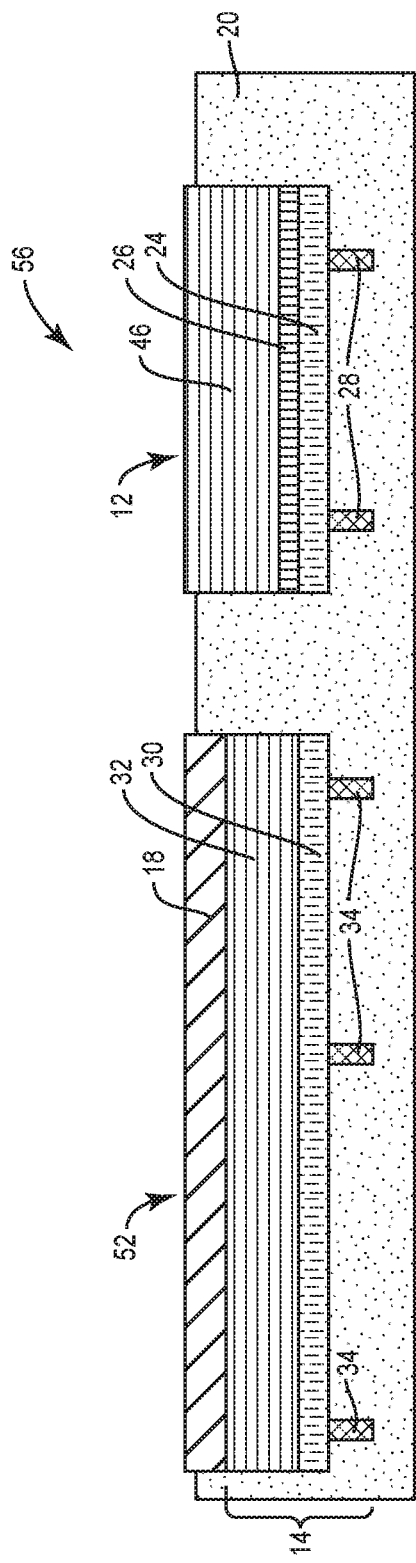

A curing process (not shown) is then used to harden the second mold compound 20. The curing temperature is between 100° C. and 320° C. depending on which material is used as the second mold compound 20. A grinding process (not shown) is followed to provide a planarized top surface of the second mold compound 20. The mold tape 54 is removed to provide a precursor package 56, which is then flipped upside down, as illustrated in FIG. 9. Herein, the second mold compound 20 resides around and underneath the first die 12 and the mold die 52, and has no portion extending above the first silicon substrate 46 of the first die 12 and the first mold compound 18 of the mold die 52. The first silicon substrate 46 of the first die 12 and the first mold compound 18 of the mold die 52 are exposed through the second mold compound 20 at a top of the precursor package 56. After the flipping, the second mold compound 20 has a planarized bottom surface, and encapsulates the downward first die bumps 28 and the downward second die bumps 34.

Since the first silicon substrate 46 of the first die 12 and the first mold compound 18 of the mold die 52 may extend into the mold tape 54, after removing the mold tape 54, a top surface of the precursor package 56 may not be flat. The backside of the first silicon substrate 46 and a top surface of the first mold compound 18 may not be flush with a top surface of the second mold compound 20. FIG. 10 shows that the top surface of the precursor package 56 is planarized to provide a mold package 58. The planarizing step may be provided by a mechanical grinding process. A top surface of the mold package 58 is essentially flat, where the top surface of the first mold compound 18, the top surface of the second mold compound 20, and the backside of the first silicon substrate 46 are coplanar, and exposed to the external environment.

FIGS. 11-16 illustrate the steps to provide the WLFO package 10 shown in FIG. 1 from the mold package 58 shown in FIG. 10. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 11-16.

Figure 11:
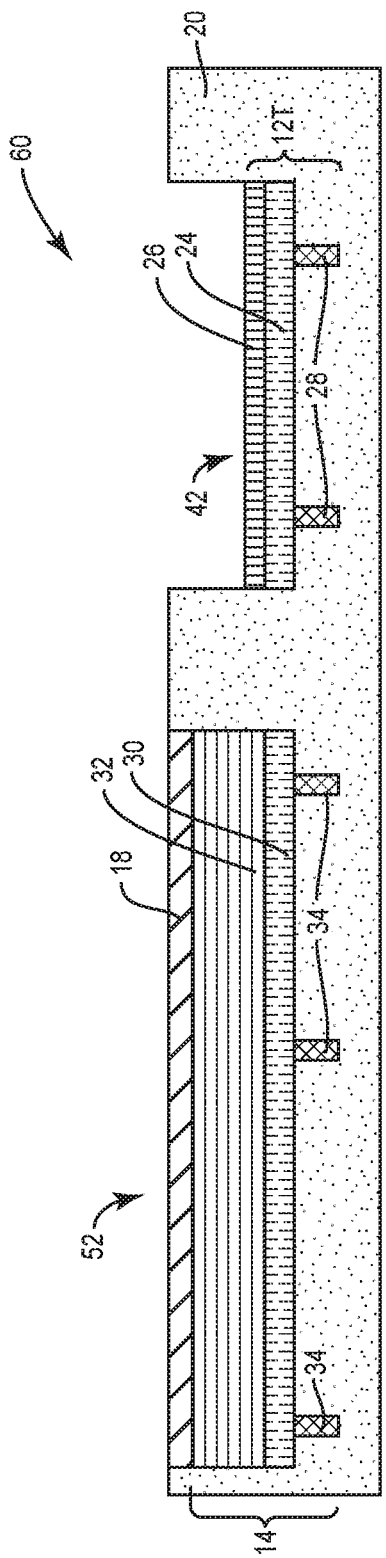

Firstly, the first silicon substrate 46 is removed substantially to provide an etched package 60, as illustrated in FIG. 11. The removal of the first silicon substrate 46 from the first die 12 provides the first thinned die 12T and forms the opening 42 within the second mold compound 20 and over the first thinned die 12T. Herein, removing substantially a silicon substrate refers to removing at least 95% of the entire silicon substrate and leaving at most 2 μm of the silicon substrate. In desired cases, the first silicon substrate 46 is removed completely, such that the first dielectric layer 26 of the first thinned die 12T is exposed at the bottom of the opening 42.

Removal of the first silicon substrate 46 may be provided by an etching process with a wet/dry etchant chemistry, which may be TMAH, KOH, ACH, NaOH, or the like. The first dielectric layer 26 may function as an etching stop to protect the first device layer 24 of the first thinned die 12T. The second mold compound 20 protects the sidewalls and the bottom surface of the first thinned die 12T from the etchant chemistry. In addition, a combination of the first mold compound 18 and the second mold compound 20 encapsulates and protects the second die 14 from the wet/dry etchant chemistry.

Figure 12A:
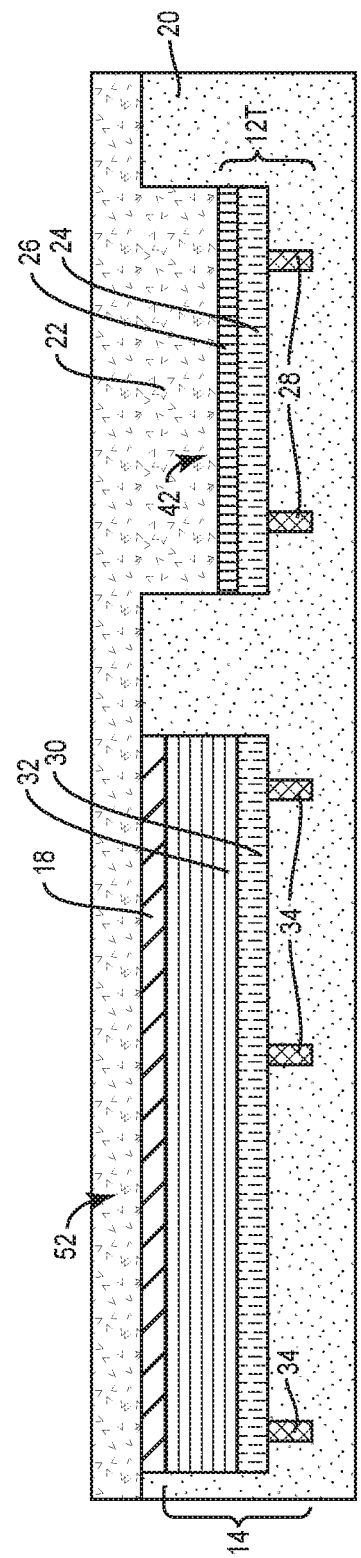

Next, the third mold compound 22 is applied to substantially fill the opening 42, as illustrated in FIG. 12A. Herein, substantially filling an opening refers to filling at least 75% of the entire opening. The third mold compound 22 directly resides over the top surface of the first thinned die 12T. If there is no first silicon substrate 46 left in the opening 42, the third mold compound 22 will directly reside over the first dielectric layer 26. In some cases, a portion of the third mold compound 22 may further reside over the first mold compound 18 and the second mold compound 20. The third mold compound 22 is separated from the second die 14 by the first mold compound 18. A top surface of the second die 12 is in contact with the first mold compound 18.

The third mold compound 22 may have a thermal conductivity greater than 2 W/m·K or greater than 10 W/m·K, and has an electrical resistivity greater than 1E6 Ohm-cm. The third mold compound 22 may be formed of thermoplastics or thermoset materials, such as PPS, overmold epoxies doped with boron nitride or alumina thermal additives, or the like. The first, second, and third mold compounds 18, 20, and 22 may be formed of a same material or different materials. For instance, the first and second mold compounds 18 and 20 may be formed from a same material, while the third mold compound 22 is formed from a different material. Unlike the third mold compound 22, the first and second mold compounds 18 and 20 do not have thermal conductivity requirements.

The third mold compound 22 may be applied by various procedures, such as sheet molding, overmolding, compression molding, transfer molding, dam fill encapsulation, and screen print encapsulation. During the molding process of the third mold compound 22, liquefaction and molding pressure may not be uniform across the entire etched package 60. Because the combination of the first thinned die 12T and a portion of the second mold compound 20 directly underneath the first thinned die 12T are thinner than other portions of the etched package 60, they may suffer more deformations than the other portions of the etched package 60. In a typical compression molding, if the third mold compound 22 is formed of high thermal conductivity materials (>=2 W/m·K), a molding pressure and a temperature used for applying the third mold compound 22 may be between 250 psi and 1000 psi, and between 100° C. and 350° C., respectively. A curing process (not shown) is then used to harden the third mold compound 22. The curing temperature is between 100° C. and 320° C. depending on which material is used as the third mold compound 22. A grinding process (not shown) is followed to provide a planarized top surface of the third mold compound 22.

Notice that the combination of the first thinned die 12T and the second mold compound portion 20 underneath the first thinned die 12T may have a thickness at least 8 μm. There is no air gap under the first thinned die 12T, and the bottom surface of the second mold compound 20 is planarized. As such, there may be no vertical deformations occurring to the first thinned die 12T during the molding step of the third mold compound 22. However, if there is no second mold compound 20 formed underneath the first thinned die 12T, especially not filling gaps between the first die bumps 28 vertically below the first thinned die 12T, vertical deformations of the first thinned die 12T may occur during the molding step of the third mold compound 22. Without support in the gaps vertically below the first thinned die 12T, the first thinned die 12T may not endure high vertical molding pressure.

Figure 12B:
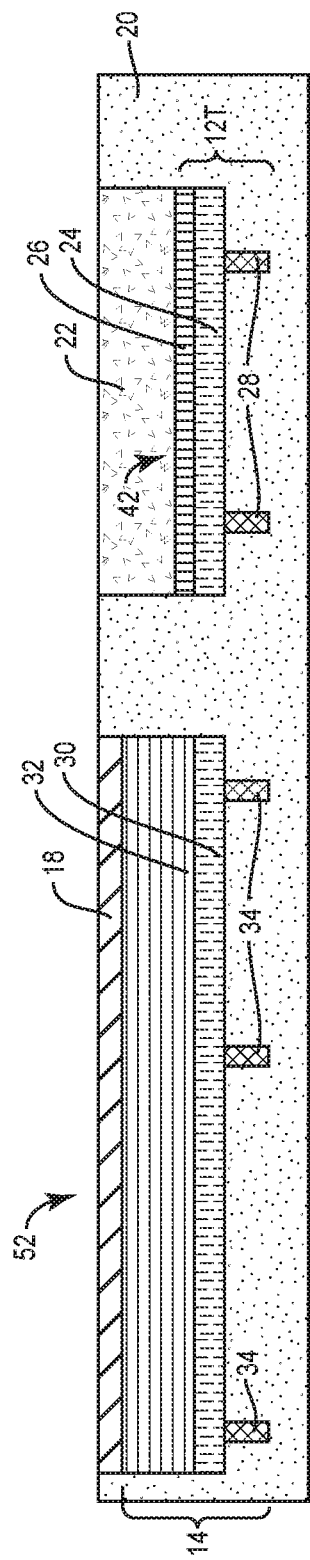

In some applications, the third mold compound 22 does not cover the top surface of the first mold compound 18 or the top surface of the second mold compound 20. Instead, the top surface of the third mold compound 22, the top surface of the first mold compound 18, and the top surface of the second mold compound 20 are coplanar, as illustrated in FIG. 12B. Further, if a portion of the third mold compound 22 resides over the first mold compound 18 and the second mold compound 20, a grinding process may be applied to thin down the third mold compound 22 until the top surfaces of the first, second, and third mold compounds 18, 20, and 22 are coplanar.

Figure 12C:
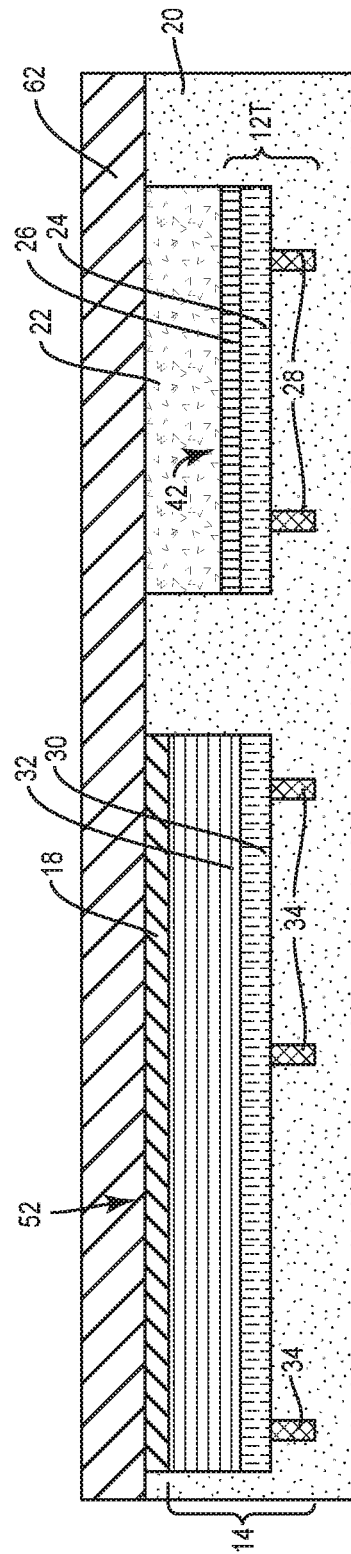

In addition, if the top surfaces of the first, second, and third mold compounds 18, 20, and 22 are coplanar, there might be a fourth mold compound 62 applied over the first, second, and third mold compounds 18, 20, and 22, as illustrated in FIG. 12C. Herein, the fourth mold compound 62 may be formed of a same or different material as the first, second, and/or third mold compounds 18, 20, and 22. For instance, the first, second, and fourth mold compounds 18, 20, and 62 are formed from a same material, while the third mold compound 22 is formed from a different material. Like the first and second mold compounds 18 and 20, the fourth mold compound 62 does not have thermal conductivity requirements. The fourth mold compound 62 may be applied by various procedures, such as sheet molding, overmolding, compression molding, transfer molding, dam fill encapsulation, and screen print encapsulation. A curing process (not shown) is then used to harden the fourth mold compound 62. The curing temperature is between 100° C. and 320° C. depending on which material is used as the fourth mold compound 62. A grinding process (not shown) is followed to provide a planarized top surface of the fourth mold compound 62.

Figure 13:
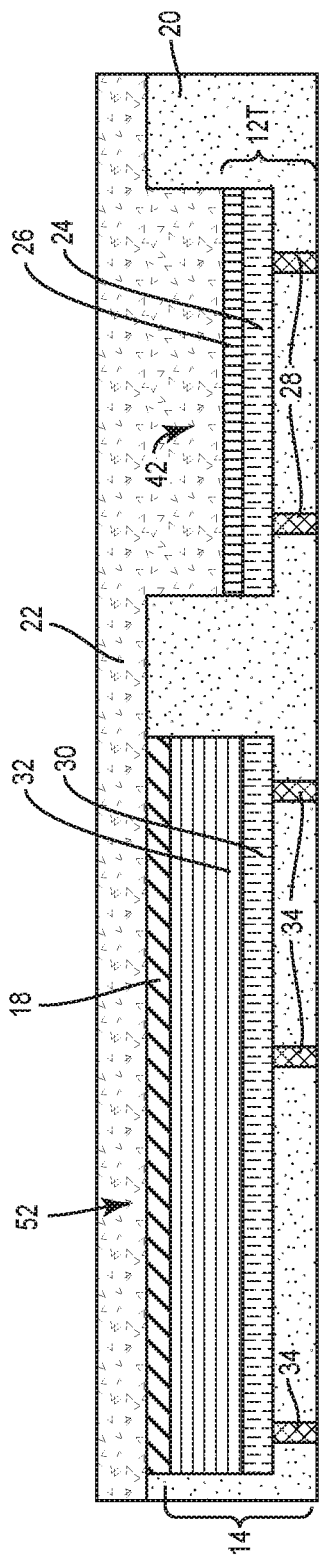

After the third mold compound 22 is applied, the second mold compound 20 is thinned to expose each first die bump 28 and each second die bump 34, as illustrated in FIG. 13. Herein, since the end of each first die bump 28 and the end of each second die bump 34 are at the same plane, each first die bump 28 and each second die bump 34 may be exposed simultaneously. In addition, since the first die bumps 28 protrude from the bottom surface the first thinned die 12T and the second die bumps 34 protrude from the bottom surface of the second die 12, the bottom surface of the first thinned die 12T and the bottom surface of the second die 14 are still fully covered by the second mold compound 20. The thinning procedure may be done with a mechanical grinding process.

Figure 14:
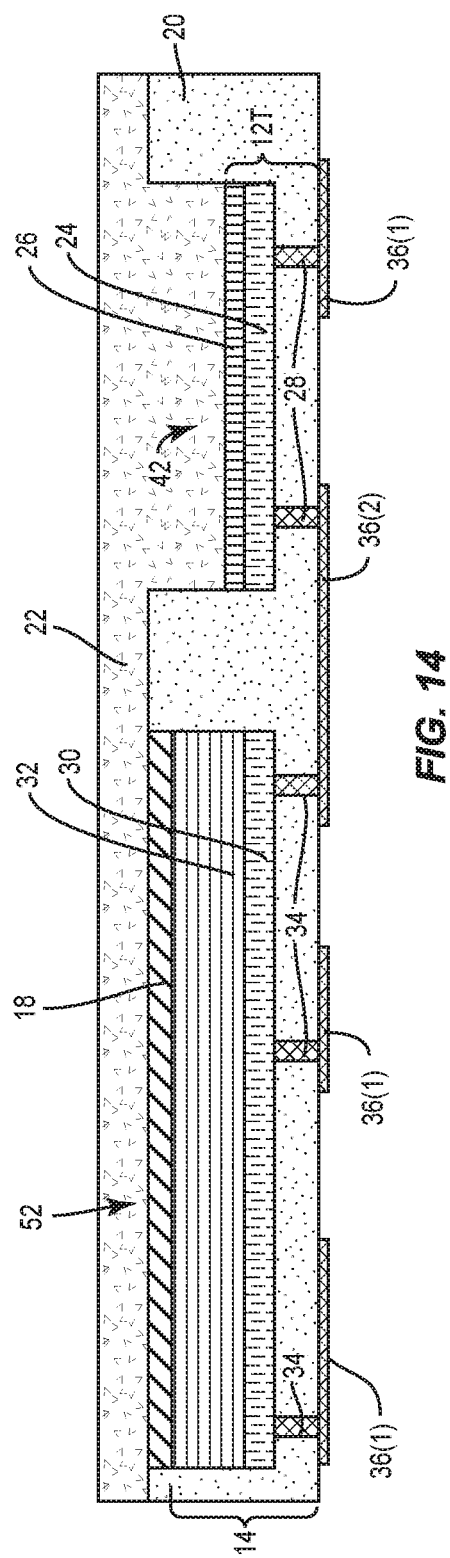
Figure 15:
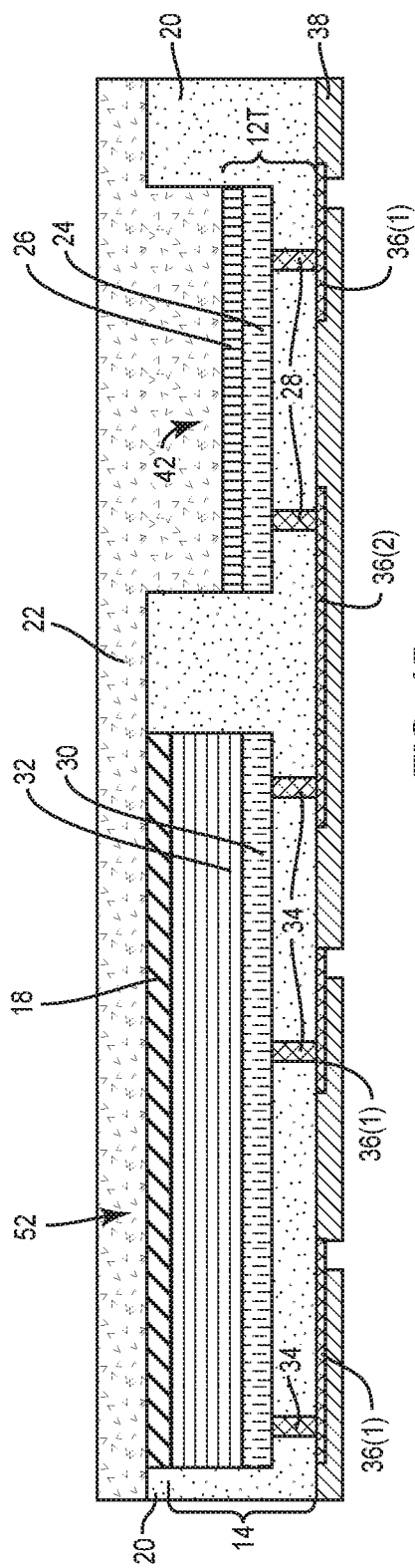
Figure 16:
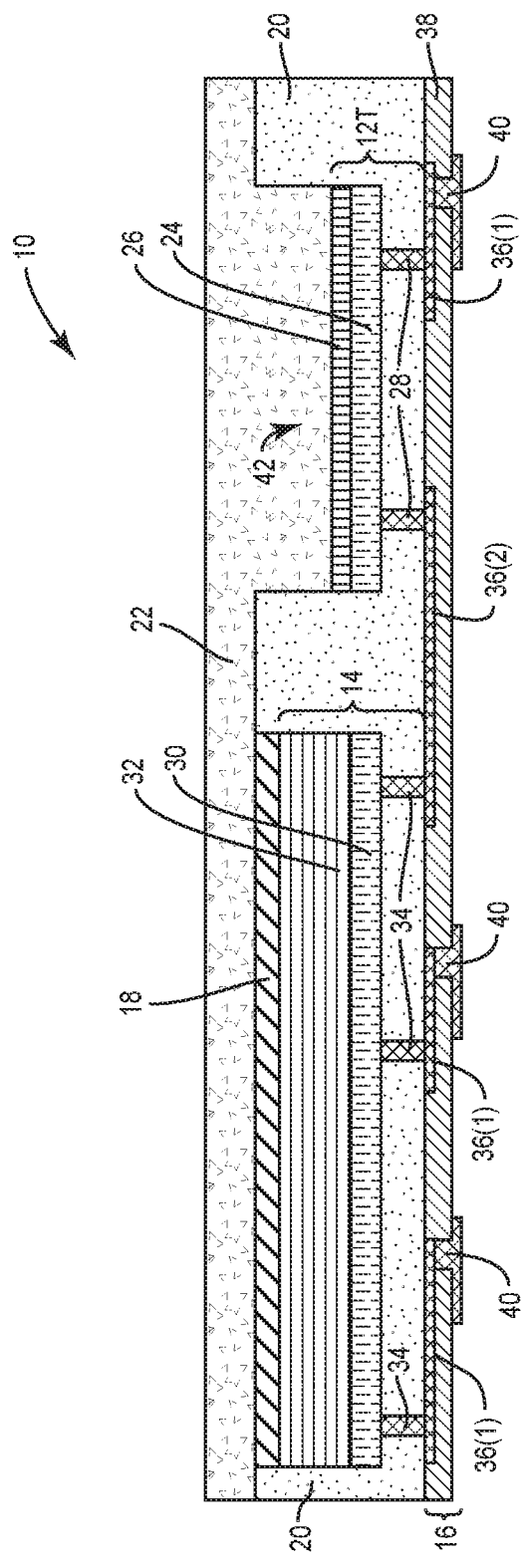

With reference to FIGS. 14 through 16, the multilayer redistribution structure 16 is formed according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 14-16.

A number of the redistribution interconnections 36 are firstly formed underneath the second mold compound 20, as illustrated in FIG. 14. For the purpose of this illustration, the redistribution interconnections 36 include three first redistribution interconnections 36(1) and one second redistribution interconnection 36(2). In different applications, the redistribution interconnections 36 may include fewer or more first redistribution interconnections 36(1)/second redistribution interconnections 36(2). Each first redistribution interconnection 36(1) is electrically coupled to the corresponding one of the exposed first and second die bumps 28 and 34. The second redistribution interconnection 36(2) is configured to connect one first die bump 28 to the corresponding second die bump 34, such that the first thinned die 12T is connected to the second die 14. The connections between the redistribution interconnections 36 and the first/second die bumps 28/34 are solder-free.

Next, the dielectric pattern 38 is formed underneath the second mold compound 20 to partially encapsulate each first redistribution interconnection 36(1) as illustrated in FIG. 15. As such, a portion of each first redistribution interconnection 36(1) is exposed through the dielectric pattern 38. Further, the dielectric pattern 38 fully encapsulates the second redistribution interconnection 36(2). Herein, no portion of the second redistribution interconnection 36(2) is exposed through the dielectric pattern 38. In different applications, there may be extra redistribution interconnections (not shown) electrically coupled to the redistribution interconnection 36 through the dielectric pattern 38, and extra dielectric patterns (not shown) formed underneath the dielectric pattern 38, such that a bottom portion of each extra redistribution interconnection is exposed.

Lastly, a number of the package contacts 40 are formed to complete the multilayer redistribution structure 16 and provide the WLFO package 10, as illustrated in FIG. 16. Each package contact 50 is formed at the bottom of the multilayer redistribution structure 16 and electrically coupled to an exposed portion of the corresponding first redistribution interconnection 36(1) through the dielectric pattern 38. Consequently, the first redistribution interconnects 36(1) connect the package contacts 40 to certain ones of the first and second die bumps 28 and 34. In addition, the package contacts 40 are separate from each other and extend underneath the dielectric pattern 38.

The multilayer redistribution structure 16 may be free of glass fiber or glass-free. Herein, the glass fiber refers to individual glass strands twisted to become a larger grouping. These glass strands may then be woven into a fabric. The dielectric pattern 38 may be formed of benzocyclobutene (BCB), polyimide, or other dielectric materials. The redistribution interconnections 36 may be formed of copper or other suitable metals. The package contacts 40 may be formed of at least one of copper, gold, nickel, and palladium. The multilayer redistribution structure 16 may have a thickness between 2 μm and 300 μm.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a first thinned die comprising a first device layer, a first dielectric layer over the first device layer, and a plurality of first die bumps underneath the first device layer;
   a second die comprising a second device layer, a silicon substrate over the second device layer, and a plurality of second die bumps underneath the second device layer;
   a multilayer redistribution structure formed underneath the first thinned die and the second die;
   a first mold compound residing over the silicon substrate of the second die;
   a second mold compound residing over the multilayer redistribution structure, around and underneath the first thinned die, and around and underneath the second die;
   wherein:
   the second mold compound extends beyond a top surface of the first thinned die to define an opening within the second mold compound and over the first thinned die, such that the top surface of the first thinned die is at a bottom of the opening; and
   a top surface of the first mold compound and a top surface of the second mold compound are coplanar; and a third mold compound filling the opening and in contact with the top surface of the first thinned die, wherein the first mold compound, the second mold compound, and the third mold compound are formed from different materials.

2. The apparatus of claim 1 wherein the multilayer redistribution structure comprises a plurality of package contacts on a bottom surface of the multilayer redistribution structure and redistribution interconnections that connect the plurality of package contacts to certain ones of the plurality of first die bumps and certain ones of the plurality of second die bumps.

3. The apparatus of claim 2 wherein:
the redistribution interconnections electrically connect the first thinned die and the second die; and
the first thinned die provides a microelectromechanical system (MEMS) component and the second die provides a complementary metal-oxide-semiconductor (CMOS) controller that controls the MEMS component.

4. The apparatus of claim 2 wherein:
the multilayer redistribution structure is glass-free;
connections between the redistribution interconnections and the plurality of first die bumps are solder-free; and
connections between the redistribution interconnections and the plurality of second die bumps are solder-free.

5. The apparatus of claim 1 wherein the first thinned die is formed from a silicon-on-insulator (SOI) structure, wherein the first device layer of the first thinned die is formed from a silicon layer of the SOI structure, and the first dielectric layer of the first thinned die is a buried oxide layer of the SOI structure.

6. The apparatus of claim 1 wherein the third mold compound has an electrical resistivity greater that 1E6 Ohm-cm.

7. The apparatus of claim 1 wherein the third mold compound has a thermal conductivity greater than 2 W/m·K.

8. The apparatus of claim 1 wherein the third mold compound has a thermal conductivity greater than 10 W/m·K.

9. The apparatus of claim 1 wherein the top surface of the first thinned die at the bottom of the opening is a top surface of the first dielectric layer.

10. The apparatus of claim 1 wherein a portion of the third mold compound resides over the first mold compound and the second mold compound.

11. The apparatus of claim 1 wherein the top surface of the first mold compound, the top surface of the second mold compound, and a top surface of the third mold compound are coplanar.

12. The apparatus of claim 1 wherein a periphery of the first mold compound and a periphery of the silicon substrate of the second die are coincident.

13. An apparatus comprising:
a first thinned die comprising a first device layer, a first dielectric layer over the first device layer, and a plurality of first die bumps underneath the first device layer;
a second die comprising a second device layer, a silicon substrate over the second device layer, and a plurality of second die bumps underneath the second device layer;
a multilayer redistribution structure formed underneath the first thinned die and the second die;
a first mold compound residing over the silicon substrate of the second die;
a second mold compound residing over the multilayer redistribution structure, around and underneath the first thinned die, and around and underneath the second die; wherein:
the second mold compound extends beyond a top surface of the first thinned die to define an opening within the second mold compound and over the first thinned die, such that the top surface of the first thinned die is at a bottom of the opening; and
a top surface of the first mold compound and a top surface of the second mold compound are coplanar;
a third mold compound filling the opening and in contact with the top surface of the first thinned die, wherein the top surface of the first mold compound, the top surface of the second mold compound, and a top surface of the third mold compound are coplanar; and
a fourth mold compound, which resides over the top surface of the first mold compound, the top surface of the second mold compound, and the top surface of the third mold compound.

14. The apparatus of claim 13 wherein the first mold compound, the second mold compound, and the fourth mold compound are formed from a same material.

15. A method comprising:
providing a precursor package that includes a first die, a second die, a first mold compound, and a second mold compound, wherein:
the first die comprises a first device layer, a first dielectric layer over the first device layer, a first silicon substrate over the first dielectric layer, and a plurality of first die bumps underneath the first device layer;
the second die comprises a second device layer, a second silicon substrate over the second device layer, and a plurality of second die bumps underneath the second device layer;
the first mold compound resides over the second silicon substrate of the second die; and
the second mold compound resides around and underneath the first die and the second die; such that the second mold compound partially covers sidewalls of the first die, covers a bottom surface of the first die, covers sidewalls and a bottom surface of the second die, partially covers sidewalls of the first mold compound, and encapsulates the first die bumps and the second die bumps, wherein the first mold compound and the first silicon substrate extend vertically beyond a top surface of the second mold compound;
planarizing a top surface of the precursor package to provide a mold package, such that a top surface of the first mold compound, the top surface of the second mold compound, and a backside of the first silicon substrate are coplanar;
removing substantially the first silicon substrate to provide a first thinned die and form an opening within the second mold compound and over the first thinned die, wherein the first thinned die has a top surface exposed at a bottom of the opening; and
applying a third mold compound to substantially fill the opening and directly contact the top surface of the first thinned die.

16. The method of claim 15 further comprising:
thinning the second mold compound to expose each of the plurality of first die bumps and each of the plurality of second die bumps; and
forming a multilayer redistribution structure underneath the second mold compound, wherein the multilayer redistribution structure comprises a plurality of package contacts on a bottom surface of the multilayer redistribution structure and redistribution interconnections that connect the plurality of package contacts to certain ones of the plurality of first die bumps and certain ones of the plurality of second die bumps.

17. The method of claim 15 wherein the third mold compound is applied by a compression molding process.

18. The method of claim 15 wherein a molding pressure used for applying the third mold compound is lower than 1000 psi.

19. The method of claim 15 wherein providing the precursor package comprises:

placing the first die and a mold die on a mold tape, wherein:

the mold die includes the second die and the first mold compound over the second die; and the first silicon substrate of the first die and the first mold compound of the mold die are in contact with the mold tape, and the plurality of first die bumps and the plurality of second die bumps are placed upward;

applying the second mold compound over the mold tape to encapsulate the first die and the mold die;

removing the mold tape to provide the precursor package, such that a portion of the first mold compound and a portion of the first silicon substrate are exposed, and protrude from the second mold compound; and flipping the precursor package, such that the plurality of first die bumps and the plurality of second die bumps are downward and encapsulated by the second mold compound, wherein no portion of the second mold compound extends above the first silicon substrate of the first die and the first mold compound.

20. The method of claim 19 wherein before placing the first die and the combination of the second die and the first mold compound on the mold tape, a thickness of the first die and a thickness of the combination of the second die and the first mold compound are the same.

* * * * *